US012749665B2

(12) United States Patent
Sung et al.

(10) Patent No.: US 12,749,665 B2
(45) Date of Patent: Sep. 29, 2026

(54) SPUTTERING APPARATUS

(71) Applicant: Samsung Display Co., LTD., Yongin-si (KR)

(72) Inventors: Gi Woon Sung, Yongin-si (KR); Myung Soo Huh, Yongin-si (KR); Nam Wook Kang, Yongin-si (KR); Jin Soo Park, Yongin-si (KR); Sung Kyu Yang, Yongin-si (KR); Doo Seon Yu, Yongin-si (KR); You Jong Lee, Yongin-si (KR); Jeong Il Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/766,794

(22) Filed: Jul. 9, 2024

(65) Prior Publication Data

US 2025/0183020 A1 Jun. 5, 2025

(30) Foreign Application Priority Data

Dec. 4, 2023 (KR) ........................ 10-2023-0173788

(51) Int. Cl.
*H01J 37/34* (2006.01)
*C23C 14/35* (2006.01)
*H01J 37/32* (2006.01)

(52) U.S. Cl.
CPC ........ *H01J 37/3455* (2013.01); *C23C 14/351* (2013.01); *H01J 37/3211* (2013.01); *H01J 37/3447* (2013.01); *H01J 2237/332* (2013.01)

(58) Field of Classification Search
CPC ........................ H01J 37/3411; H01J 37/32651
USPC ..................................................... 204/298.09
See application file for complete search history.

(56) References Cited

U.S. PATENT DOCUMENTS

| | | | | |
|---|---|---|---|---|
| 3,630,873 A * | 12/1971 | Moore et al. | H01B 1/00 | 204/298.14 |
| 3,630,881 A * | 12/1971 | Lester et al. | B05B 5/001 | 204/192.12 |
| 5,935,395 A * | 8/1999 | Ouellet | F04B 37/02 | 118/724 |
| 6,210,539 B1 * | 4/2001 | Tanaka | H01J 37/321 | 204/192.12 |

(Continued)

FOREIGN PATENT DOCUMENTS

| | | |
|---|---|---|
| KR | 100645038 B1 | 11/2006 |
| KR | 101371077 B1 | 3/2014 |

(Continued)

OTHER PUBLICATIONS

Maxcool Cryochillers, URL: https://www.edwardsvacuum.com/ko-kr/our-markets/semiconductor-and-electronics/cryogenics/cryochillers/maxcool-cryochillers, 4 pages.

(Continued)

*Primary Examiner* — John J Brayton
(74) *Attorney, Agent, or Firm* — CANTOR COLBURN LLP

(57) ABSTRACT

A sputtering apparatus includes: a chamber; a target disposed inside the chamber; a coil disposed adjacent to the target; a moving member on which the coil is disposed, where the moving member adjusts a position of the coil; and a coil shield disposed inside the chamber to overlap the coil. An opening is defined in the coil shield.

19 Claims, 8 Drawing Sheets

(56) References Cited

U.S. PATENT DOCUMENTS

| | | | | |
|---|---|---|---|---|
| 6,235,163 | B1 * | 5/2001 | Angelo | H01J 37/32724 204/192.12 |
| 6,481,223 | B2 | 11/2002 | Flynn et al. | |
| 7,234,310 | B2 | 6/2007 | Flynn et al. | |
| 9,337,067 | B2 * | 5/2016 | Roy | H01L 21/6831 |
| 9,668,373 | B2 * | 5/2017 | West | H01L 21/6833 |
| 2021/0254212 | A1 | 8/2021 | Tanabe et al. | |
| 2022/0384157 | A1 * | 12/2022 | Wang | H01J 37/32568 |
| 2023/0143413 | A1 * | 5/2023 | Li | C23C 14/541 165/53 |

FOREIGN PATENT DOCUMENTS

| | | | |
|---|---|---|---|
| KR | 1020220104146 | A | 7/2022 |
| KR | 1020230008774 | A | 1/2023 |
| KR | 102520358 | B1 | 4/2023 |
| WO | 2021170209 | A1 | 9/2021 |

OTHER PUBLICATIONS

Tom Benedict et al., “Converting a liquid nitrogen cooled camera to closed cycle cooling,” Proceedings of the SPIE, vol. 7735, id. 77352M, Jul. 15, 2010, 10 pages.

* cited by examiner

SPUTTERING APPARATUS

This application claims priority to Korean patent application No. 10-2023-0173788, filed on Dec. 4, 2023, and all the benefits accruing therefrom under 35 U.S.C. § 119, the content of which in its entirety is herein incorporated by reference.

BACKGROUND

1. Field

The disclosure generally relates to a sputtering apparatus.

2. Related Art

With the development of information technologies, the use of a display device which is a connection medium between a user and information increases. A thin film deposition process may be performed to manufacture the display device.

The thin film deposition process may be performed based on various process methods. For example, a sputtering apparatus may be used to perform the thin film deposition process. The sputtering apparatus may apply electrical energy to ions in plasma such that the ions collide with a target, and then allow target atoms ejected, i.e., sputtered, from the target to be deposited on a substrate.

SUMMARY

In a thin film deposition process using a sputtering apparatus, it may be desired to properly control the amount of a material (e.g., moisture) for determining the quality of the thin film while forming a pressure condition close to vacuum in a chamber of the sputtering apparatus to improve the quality of a thin film.

Embodiments provide a sputtering apparatus capable of controlling the amount of a material for determining the quality of a thin film while forming a pressure condition close to vacuum in a chamber of the sputtering apparatus.

In accordance with an embodiment of the disclosure, a sputtering apparatus includes: a chamber; a target disposed inside the chamber; a coil disposed adjacent to the target; a moving member on which the coil is disposed, where the moving member adjusts a position of the coil; and a coil shield disposed inside the chamber to overlap the coil, where an opening is defined in the coil shield.

In an embodiment, the coil may be movable in a first direction which is a direction perpendicular to a plane on which the coil is disposed.

In an embodiment, the sputtering apparatus may further include a substrate disposed inside the chamber. In such an embodiment, the target may include a material to be deposited on the substrate. In such an embodiment, one surface of the substrate may face a plane on which the coil is disposed. In such an embodiment, the coil may be disposed between the substrate and the moving member.

In an embodiment, the moving member may be a stage which adjusts a height at which the coil is disposed.

In an embodiment, the moving member may include a screw or a cylinder.

In an embodiment, the screw or the cylinder may be provided in plural, and moving member may adjust the height at which the coil is disposed.

In an embodiment, the coil shield may be disposed between the substrate and the coil.

In an embodiment, the coil shield may include a first coil shield and a second coil shield disposed on the first coil shield. In such an embodiment, the first coil shield and the second coil shield may be slidably in contact with each other.

In an embodiment, a first opening may be defined in the first coil shield, and a second opening may be defined in the second coil shield. In such an embodiment, each of the first opening and the second opening may have a polygonal, circular or elliptical planar shape.

In an embodiment, the first coil shield and the second coil shield may have a same shape as each other. In such an embodiment, each of the first opening and the second opening may be provided in plural.

In an embodiment, the first coil shield and the second coil shield may be disposed in a first sliding state and a second sliding state. In such an embodiment, in the first sliding state, the first opening and the second opening may entirely overlap each other. In such an embodiment, in the second sliding state, the first opening and the second opening may not overlap each other.

In an embodiment, the coil shield may have a quadrangular cross section.

In an embodiment, the coil shield may include a first end portion and a second end portion. In such an embodiment, the coil shield may include a protrusion at each of the first end portion and the second end portion.

In an embodiment, the coil may include a first portion including an elastic material or a flexible material.

In an embodiment, at least a portion of the first portion may correspond to an inlet through which a refrigerant flows therein.

In accordance with another embodiment of the disclosure, there is provided a sputtering apparatus including: a chamber; a target disposed inside the chamber; a coil disposed adjacent to the target; and a coil shield disposed inside the chamber to overlap the coil, where the coil shield includes a first coil shield and a second coil shield disposed on the first coil shield, and the first coil shield and the second coil shield are slidably in contact with each other.

In an embodiment, the sputtering apparatus may further include a substrate disposed inside the chamber. In such an embodiment, the target may include a material to be deposited on the substrate. In such an embodiment, one surface of the substrate may face a plane on which the coil is disposed. In such an embodiment, the coil shield may be disposed between the substrate and the coil.

In an embodiment, a first opening may be defined in the first coil shield, and a second opening may be defined in the second coil shield. In such an embodiment, each of the first opening and the second opening may have a polygonal, circular or elliptical planar shape.

In an embodiment, the first coil shield and the second coil shield may have a same shape as each other. In such an embodiment, each of the first opening and the second opening may be provided in plural.

In an embodiment, the coil may include a first portion including an elastic material or a flexible material. In such an embodiment, at least a portion of the first portion may correspond to an inlet through which a refrigerant flows therein.

BRIEF DESCRIPTION OF THE DRAWINGS

The above and other features of the invention will become more apparent by describing in further detail embodiments thereof with reference to the accompanying drawings, in which.

DETAILED DESCRIPTION

Figure 1:
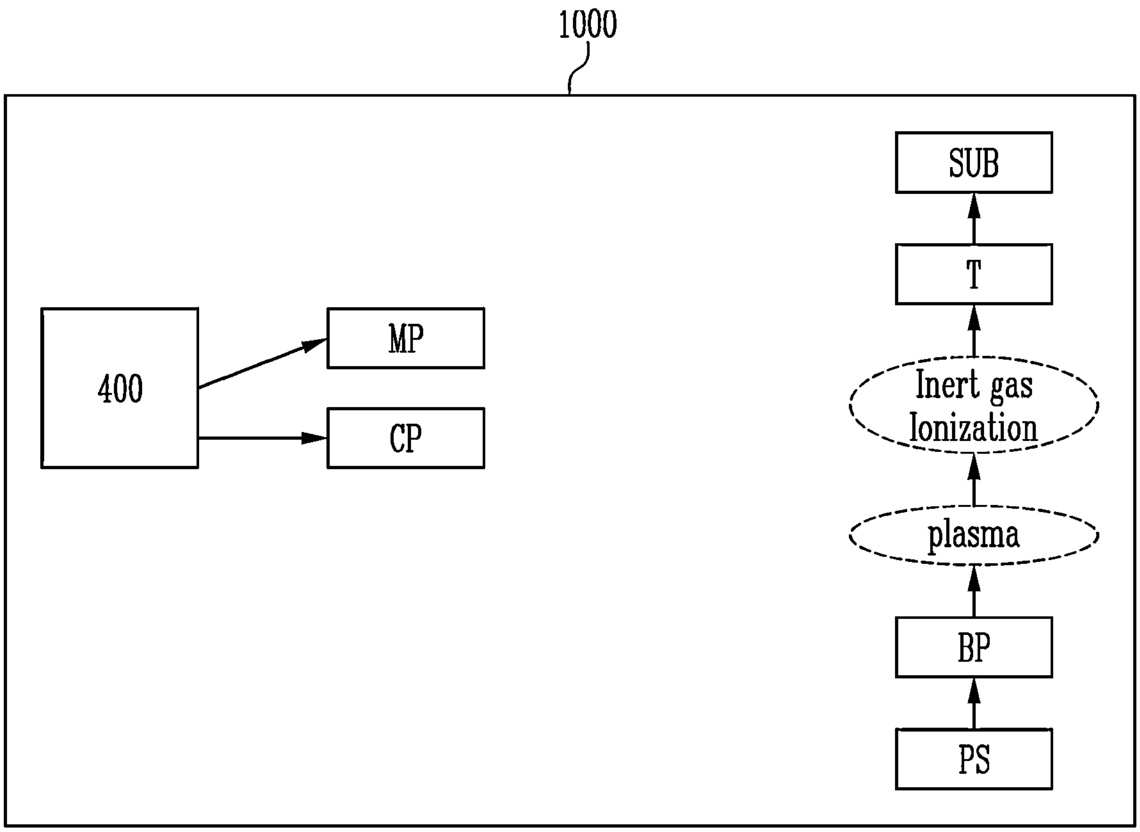
FIG. 1 is a schematic block diagram illustrating a principle of a sputtering apparatus in accordance with an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. Thus, reference to "an" element in a claim followed by reference to "the" element is inclusive of one element and a plurality of the elements. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "on" another element, it can be directly on the other element or intervening elements may be present therebetween. In contrast, when an element is referred to as being "directly on" another element, there are no intervening elements present.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

The disclosure generally relates to a sputtering apparatus. Hereinafter, a sputtering apparatus in accordance with an embodiment of the disclosure will be described with reference to the accompanying drawings.

Figure 2:
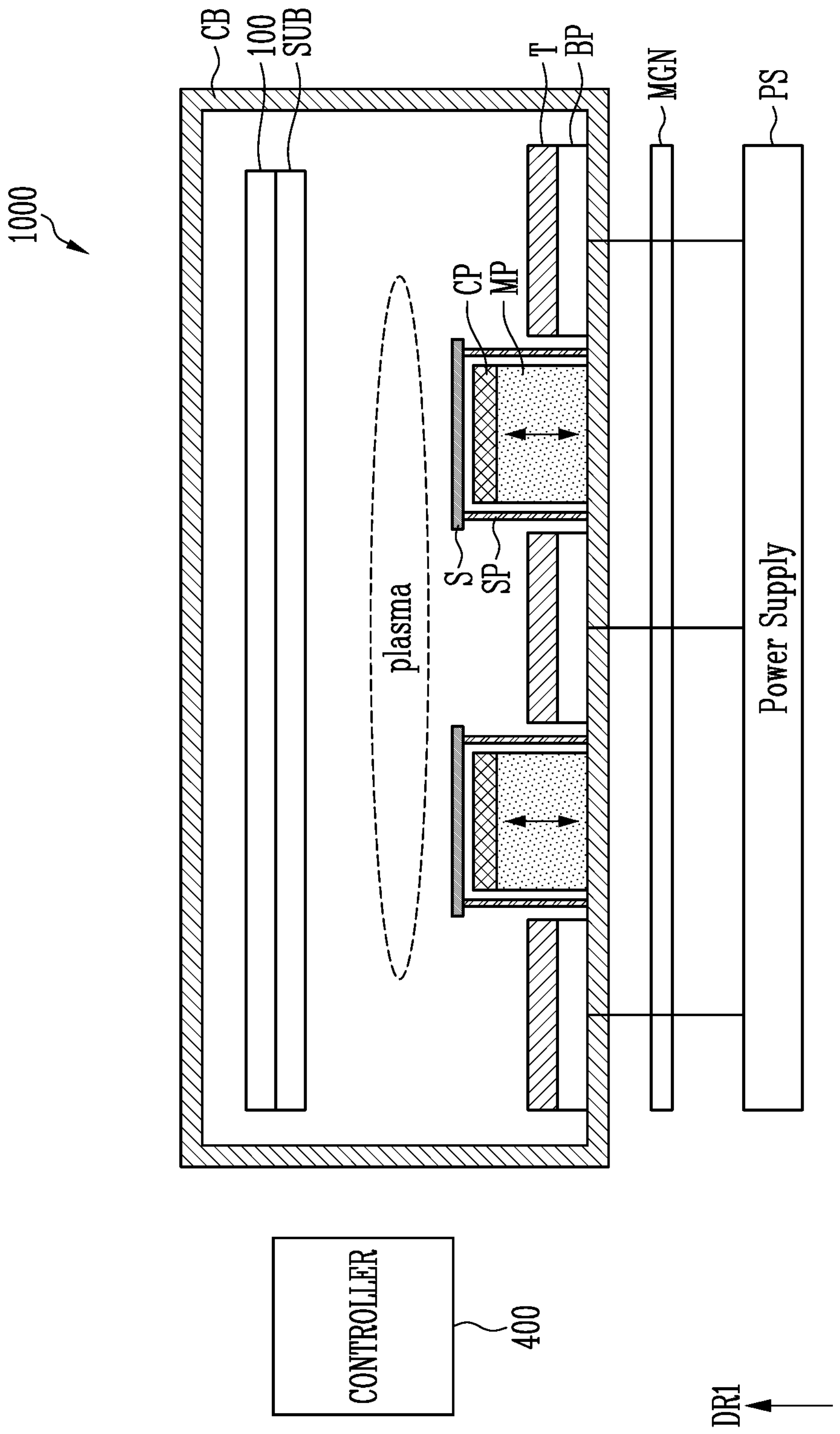
FIG. 2 is a schematic sectional view illustrating a sputtering apparatus in accordance with an embodiment of the disclosure.

FIG. 1 is a schematic block diagram illustrating a principle of a sputtering apparatus in accordance with an embodiment of the disclosure. FIG. 2 is a schematic sectional view illustrating a sputtering apparatus in accordance with an embodiment of the disclosure.

Referring to FIGS. 1 and 2, an embodiment of a sputtering apparatus 1000 may include a chamber CB, a target T, a back-plate BP, a power supply PS, a magnet MGN, a coil CP, a coil shield S, and a controller 400.

The sputtering apparatus 1000 may form a film (e.g., a thin film) on a substrate SUB. The substrate SUB may be a substrate for manufacturing a panel of a display device. However, the disclosure is not limited thereto, and the substrate SUB may be a semiconductor substrate for manufacturing a semiconductor device such as a wafer.

The chamber CB may provide a deposition processing space for inducing film formation of the substrate SUB. In an embodiment, for example, the chamber CB may have a circular structure or a quadrangular structure, or may have other various types of structures.

The chamber CB may include at least one selected from a metal material such as stainless steel, aluminum (Al), titanium (Ti) or copper (Cu), a material such as quartz or glass, which observation of the interior thereof is possible, and a material such as ceramic having an adiabatic effect. However, the disclosure is not limited thereto.

The chamber CB may include a substrate support part 100 on which the substrate SUB is disposed (or mounted). The substrate support part 100 may be a carrier which carries the substrate SUB. The substrate SUB may be mounted and located on a top surface of the substrate support part 100. Various means configured with any one of a lift pin, an electrostatic chuck, and an adhesive chuck or a combination thereof may be applied to the substrate support part 100. In some embodiments, the substrate support part 100 may rotate the substrate SUB while a deposition process on the substrate SUB is performed. In some embodiments, the chamber CB may have an inlet/an outlet formed therein to carry the substrate SUB in the chamber CB and carry the substrate SUB out of the chamber CB.

A certain level of vacuum state may be maintained inside the chamber CB such that the deposition process is smoothly performed. In some embodiments, the chamber CB may be connected to a vacuum pump for forming the vacuum state therein.

An inert gas for generating plasma may be provided (e.g., accommodated) inside the chamber CB. In some embodiments, the chamber CB may be connected to a gas supply, to be provided with an inert gas such as argon (Ar).

The target T may be disposed inside the chamber CB. The target T may be a material including a deposition material to be sputtered by plasma generated inside the chamber CB. The target T may be disposed on one surface of the back-plate BP toward the substrate SUB. The target T may include a material such as a metal to be deposited on the substrate SUB. In an embodiment, for example, when an organic light emitting display device is manufactured, the target T may include at least one selected from various metals such as aluminum (Al), molybdenum (Mo), copper (Cu), gold (Au), and platinum (Pt), which are used to form an electrode and the like, or may include indium tin oxide (ITO) and the like as a film forming material of a transparent electrode. In some embodiments, the target T may be provided in plural. However, the disclosure is not limited thereto. The target T may include various materials known in the art as the material of the target T, and be provided in singular.

The back-plate BP may be disposed opposite to the substrate SUB, and one surface of the back-plate BP, which faces the substrate SUB, may support the target T. In some embodiments, the back-plate BP may rotate while supporting the target T. In some embodiments, a width of the back-plate BP may be equal to a width of the target T. In some embodiments, the back-plate BP may be disposed to overlap the target T.

The back-plate BP may be connected to the power supply PS which supplies radio frequency (RF) power or direct current (DC) power. The back-plate BP may receive a voltage applied from the power supply PS to serve as a cathode in plasma discharge.

When a voltage is applied to the back-plate BP, plasma discharge may occur inside the chamber CB. An inert gas such as argon (Ar) may be ionized by the plasma discharge, and ionized particles may be accelerated toward the target T, to collide with the target T. Accordingly, atoms constituting the target T are discharged, to be deposited on the substrate SUB.

The magnet MGN may be located to face another surface of the back-plate BP, which is opposite to the target T, and form a magnetic field. The magnet MGN may have a plurality of magnets having polarities opposite to each other, which are alternately disposed therein, such that the magnetic field can be formed on the entire surface of the target T.

In an embodiment of the disclosure, as shown in FIG. 2, the magnet MGN may be disposed outside of the chamber CB. However, the disclosure is not limited thereto. In some embodiments, the magnet MGN may be disposed inside the chamber CB.

The coil CP may be disposed adjacent to the target T. In some embodiments, where the target T is provided in plural, the coil CP may be disposed between targets T. In some embodiments, the coil CP may be disposed not to overlap the target T in a plan view. However, the disclosure is not limited thereto. According to another embodiment, the coil CP and the target T may be disposed to overlap each other. In some embodiments, one surface of the coil CP may be disposed while facing one surface of the substrate SUB.

In some embodiments, at least a portion of the coil CP may be disposed in the chamber CB, and at least another portion of the coil CP may be disposed outside the chamber CB. For convenience of description, only a portion of the coil CP disposed inside the chamber CB, and a position and a structural characteristic of the coil CP associated with the chamber CB will be described later with reference to drawings from FIG. 4.

The coil CP may include a tube through which a refrigerant (or a cooling fluid) such as a coolant can flow. In an embodiment, for example, the coil CP may be formed with a hollow metal tube of which at least a portion includes at least one selected from copper (Cu), brass, and aluminum (Al), and the refrigerant may flow in a hollow portion. In some embodiments, the temperature of the refrigerant may be controlled based on a characteristic of a thin film to be formed in the sputtering process.

In an embodiment, the coil CP includes the refrigerant to adsorb water ($H_2O$) in the chamber CB. When an oxide semiconductor layer is formed on the substrate SUB, the quality of the thin film may be deteriorated when the water ($H_2O$) in the chamber CB is not adsorbed. For example, when the oxide semiconductor layer is formed on the substrate, it may be difficult to manufacture a highly reliable thin film transistor when the water ($H_2O$) in the chamber CB is not adsorbed.

The sputtering apparatus 1000 in accordance with an embodiment of the disclosure includes the coil CP in which the refrigerant flows, such that the coil CP can adsorb the water ($H_2O$) in the chamber CB, and a highly reliable thin film transistor can be manufactured.

The coil CP may control a temperature change of the target T. For example, when the temperature of the target T increases as ions collide with the target in performance of the sputtering process, the coil CP may suppress an increase in the temperature of the target T.

In some embodiments, the sputtering apparatus 1000 may further include a moving member MP disposed under the coil CP. In the disclosure, a lower direction may be defined as a gravity direction, and an upper direction may be defined as a direction opposite to the gravity direction, e.g., a first direction DR1.

The moving member MP may support the coil CP. The coil CP may be disposed on the moving member MP.

The moving member MP may control (or adjust) a position of the coil CP. The moving member MP may move the coil CP. In an embodiment, for example, the coil CP is disposed on the moving member MP, such that the moving member MP and the coil CP can move together.

The moving member MP may adjust a position of the coil CP with respect to a position of the substrate SUB on which the target T is deposited. The moving member MP may move the coil CP in a first movement direction. The moving member MP may move the coil CP in a second movement direction opposite to the first movement direction. In an embodiment, for example, the moving member MP may move the coil CP in the first direction DR1 as a direction perpendicular to a plane on which the substrate SUB is disposed or a direction towards the substrate SUB such that the substrate SUB and the coil CP become close to each other. In an embodiment, for example, the moving member MP may move the coil CP in the opposite direction of the first direction DR1 such that the substrate SUB and the coil CP become distant from each other.

In some embodiments, the coil CP may move in the first direction as a height direction thereof. However, the disclosure is not limited thereto. In some embodiments, the coil CP may move in a plane direction (e.g., a second direction DR2 (see FIG. 4) or a third direction DR3 (see FIG. 4)) as a direction in which the plane on which the substrate SUB is disposed extends.

In some embodiments, the moving member MP may be a stage which enables height adjustment. In an embodiment, for example, the stage may be configured to adjust (or control) a height at which the coil CP is disposed. In some embodiments, the moving member MP may include a cylinder or a screw, which enables height adjustment. In an embodiment, for example, the cylinder or the screw may be configured to adjust a height at which the coil CP is disposed.

In some embodiments, where the moving member MP includes a cylinder or a screw, which enables height adjustment, the cylinder or the screw may be provided in plural to fix a partial area of the coil CP. In an embodiment, for example, four or more cylinders may be used, to fix four or more areas of the coil CP. In an embodiment, for example, four or more screws may be used, to fix four or more areas of the coil CP.

In some embodiments, the moving member MP may further include a displacement sensor. The moving member MP includes the displacement sensor to detect a position of the coil CP and to adjust the flatness of a height at which the coil CP is disposed while adjusting the height of the coil CP.

The sputtering apparatus 1000 in accordance with an embodiment of the disclosure may adjust an adsorption amount of the water ($H_2O$) in the chamber CB through position adjustment of the coil CP. In an embodiment, for example, when the height of the coil CP is adjusted, the distance between the coil CP and the substrate SUB may be changed. As the distance between the coil CP and the substrate SUB is changed, the distance of the water ($H_2O$) in the chamber CB from the coil CP may be changed. In an embodiment, for example, in the case of the water ($H_2O$) located closer to the substrate SUB than the coil CP, the water ($H_2O$) may be further adsorbed to the coil CP as the coil CP becomes closer to the substrate SUB.

The coil shield S may be disposed to overlap at least a portion of the coil CP in a plan view. In an embodiment, for example, the coil shield S may overlap at least a portion of the coil CP in a plan view on which the coil CP or the substrate SUB is disposed. The coil shield S may be located between the coil CP and the substrate SUB. The coil shield S may overlap at least a portion of the coil CP, and protect the at least a portion of the coil CP, thereby reducing a deposition amount of the target T deposited on the coil CP.

The coil shield S may be provided with an opening H (see FIG. 6), and the sputtering apparatus 1000 may adjust an adsorption amount of the water ($H_2O$) in the chamber CB through opening ratio adjustment of the opening H. This will be described later with reference to FIG. 5.

In some embodiment, the sputtering apparatus 1000 may further include a shield support part SP for supporting the coil shield S. The coil shield S may be disposed on the shield support part SP. The coil shield S may be supported by the shield support part SP.

The coil shield S may be movable. In an embodiment, for example, the coil shield S may be movable in a direction in which the plane on which the coil CP is disposed extends. As the coil shield S moves, the opening ratio of the opening H of the coil shield S can be adjusted.

The controller 400 may be configured to control overall operations of the sputtering apparatus 1000. The controller 400 may be implemented a central processing unit (CPU) or a device similar thereto corresponding to hardware, software, or a combination thereof. In a hardware manner, the controller 400 may be provided in the form of an electronic circuit which performs a control function by processing an electrical signal. In a software manner, the controller 400 may be formed in the form of a program, an application, firmware or the like, which is processed by the controller as hardware.

The controller 400 may determine movements of the coil shield S and the moving member MP. In an embodiment, for example, the controller 400 may control movement of each of the coil shield S and the moving member MP.

The controller 400 may control the coil shield S to move in the direction in which the plane on which the coil CP is disposed extends. The controller 400 may control the moving member MP to move in the direction (e.g., the first direction DR1) perpendicular to the plane on which the coil CP is disposed.

In the sputtering apparatus 1000 in accordance with an embodiment of the disclosure, the movement of the coil shield S and the moving member MP can be controlled, and the adsorption amount of the water ($H_2O$) in the chamber CB can be adjusted (or controlled) based on the movement of the coil shield S and the moving member MP. Thus, the chamber CP may not be manually opened to manually remove the water ($H_2O$) in a process of adsorbing the water ($H_2O$), and process convenience can be improved.

Figure 3:
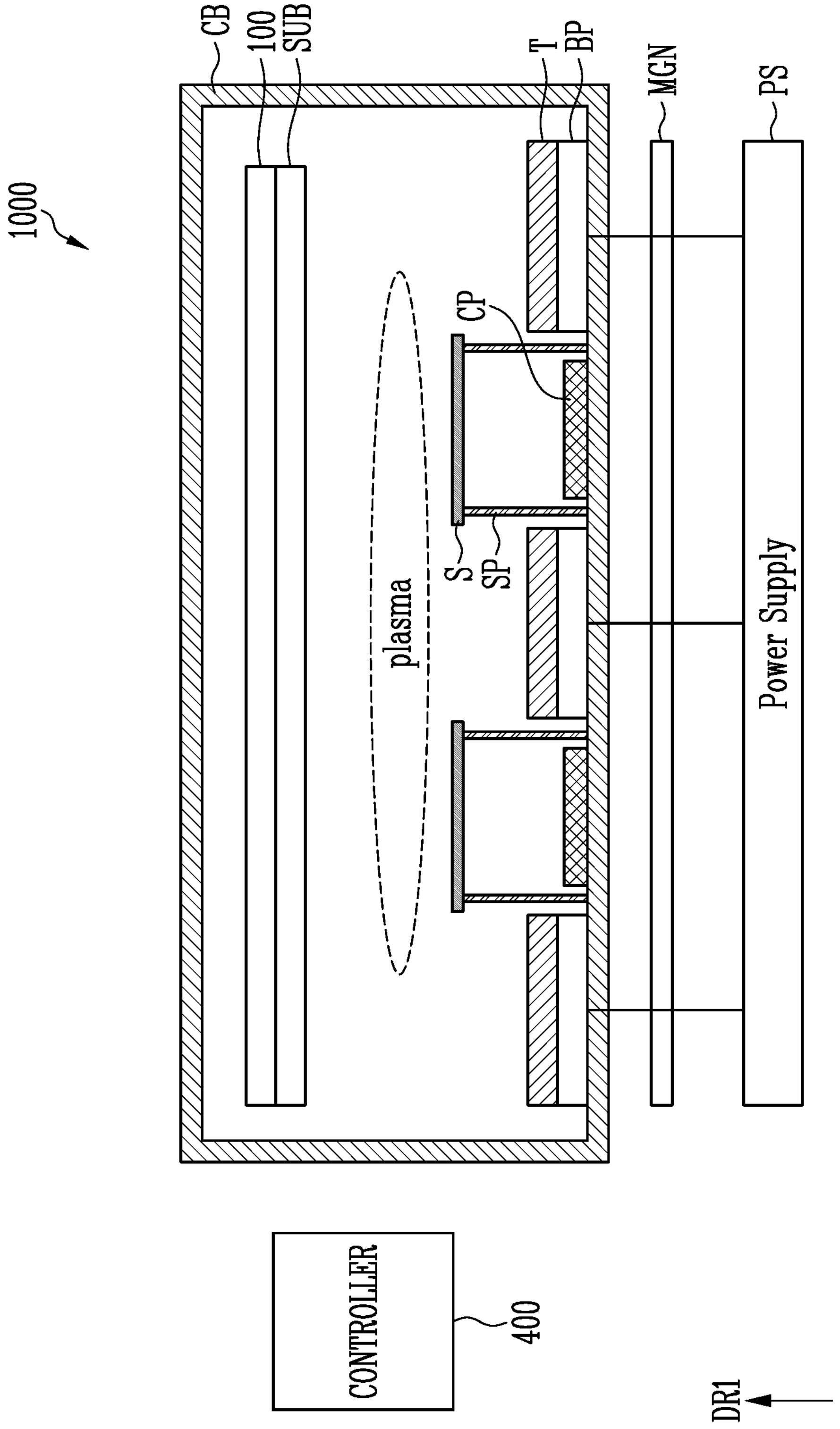
FIG. 3 is a schematic sectional view illustrating a sputtering apparatus in accordance with another embodiment of the disclosure.

FIG. 3 is a schematic sectional view illustrating a sputtering apparatus in accordance with another embodiment of the disclosure. Hereinafter, a sputtering apparatus 1000 in accordance with another embodiment of the disclosure will be described. The embodiments of the sputtering apparatus 1000 shown in FIG. 3 is substantially the same as the embodiment shown in FIG. 2, except that the sputtering apparatus 1000 does not include the moving member MP.

Hereinafter, any repetitive detailed descriptions of with the same or like elements as those described above will be omitted.

In some embodiments, the coil CP may be fixed at one position (e.g., a predetermined position) in the chamber CB. In an embodiment, for example, the coil CP may be fixed on one surface in the chamber CB. The coil CP may be disposed on the one surface in the chamber CB. The one surface in the chamber CB, on which the coil CP is disposed, may be a surface supporting the back-plate BP and the coil CP.

The controller 400 may determine whether the coil shield S is to move. In an embodiment, for example, the controller 400 may control the movement of the coil shield S. The controller 400 may control the coil shield S to move in a direction in which the plane on which the coil CP is disposed extends.

The sputtering apparatus 1000 in accordance with an embodiment of the disclosure may include the coil shield S which includes the opening H and is movable, and adjust the adsorption amount of the water ($H_2O$) in the chamber CB. Accordingly, the chamber CP may not be manually opened to manually remove the water ($H_2O$) in the process of adsorbing the water ($H_2O$), and the process convenience can be improved.

Hereinafter, a structure and an arrangement of the coil CP will be described with reference to FIGS. 4 and 5.

Figure 4:
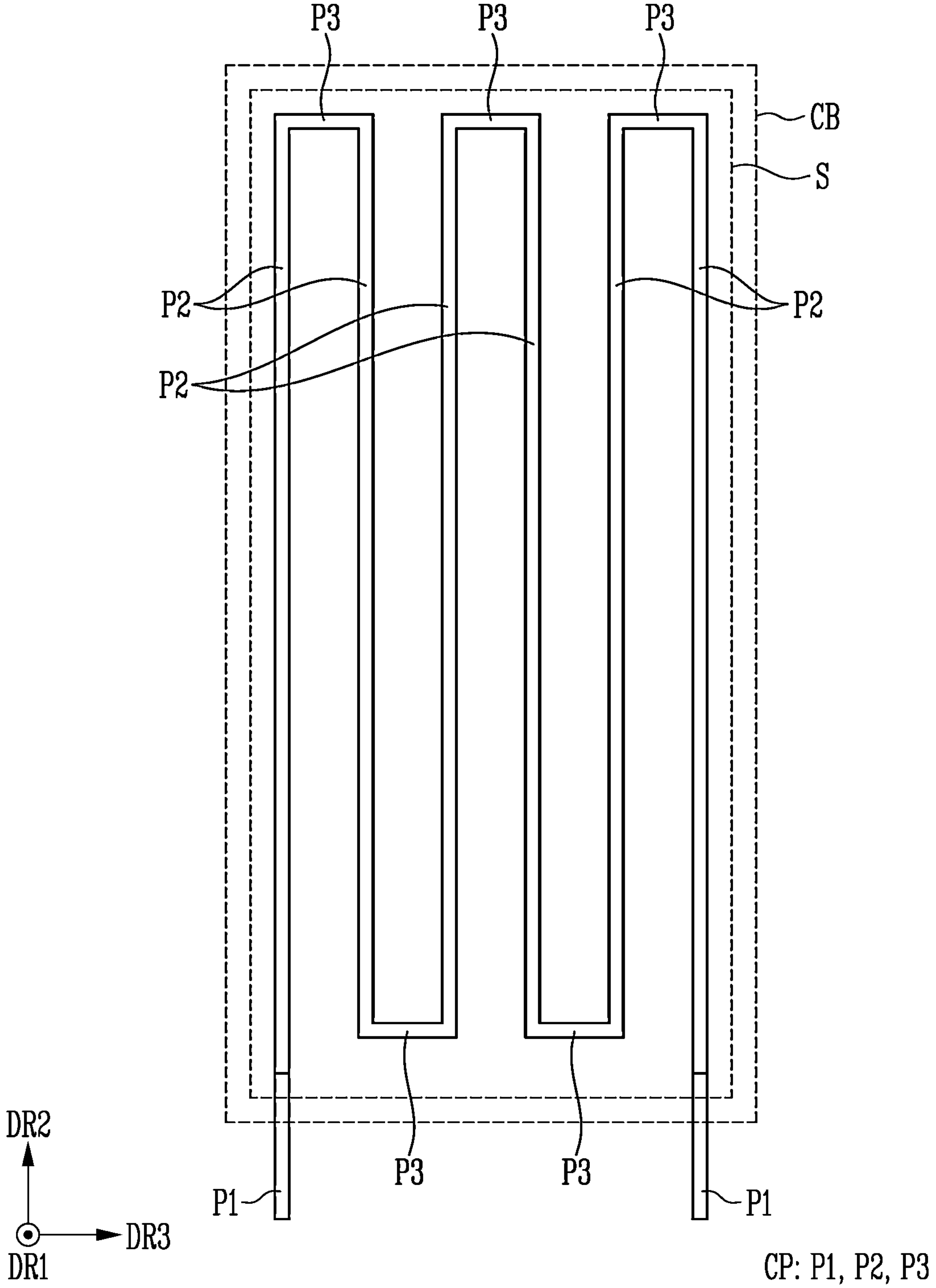
FIGS. 4 and 5 are plan views schematically illustrating shapes of a coil in accordance with embodiments of the disclosure.
Figure 5:
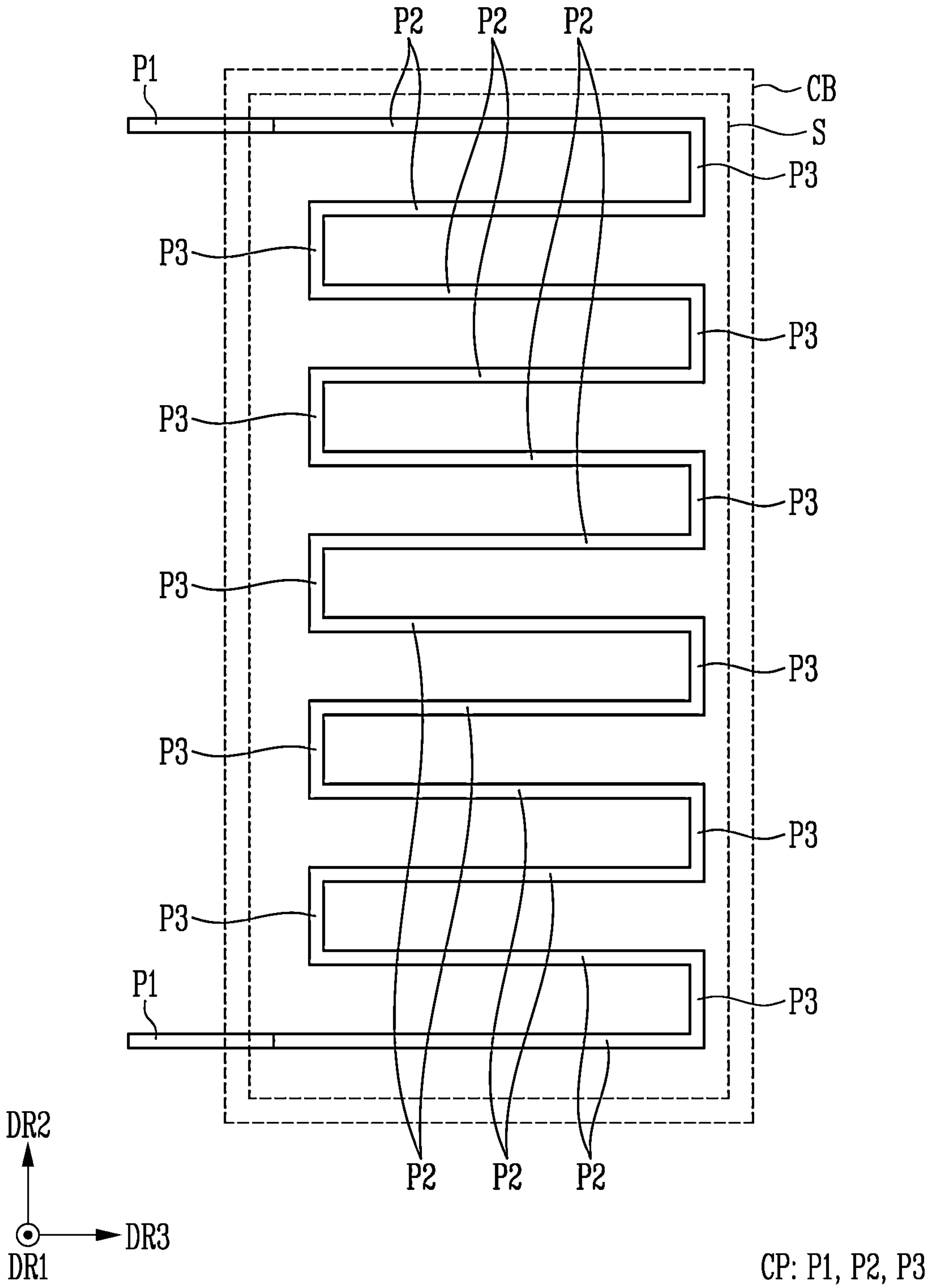

FIGS. 4 and 5 are plan views schematically illustrating shapes of the coil in accordance with embodiments of the disclosure. FIG. 4 may show a shape of the coil in accordance with an embodiment of the disclosure, and FIG. 5 may show a shape of the coil in accordance with another embodiment of the disclosure. For convenience of illustration and description, only the chamber CB, the coil shield S, and the coil CP are illustrated in FIGS. 4 and 5 to show structures of the coil CP more clearly, and the components except the coil CP are illustrated by a dotted line.

The coil CP may be repeatedly bent in a zigzag form to have a shape in which the coil CP is disposed in a plurality of columns. The coil CP may include a plurality of bending portions. In an embodiment, for example, at least a portion of the coil CP may have an "L" shape. However, the disclosure is not necessarily limited thereto.

Referring to FIG. 4, in an embodiment, at least a portion of the coil CP may be disposed in the chamber CB, and at least another portion of the coil CP may be disposed outside the chamber CB. In an embodiment, for example, the coil CP may include first portions P1, second portions P2, and third portions P3.

The first portions P1 may extend in the second direction DR2, and at least a portion of each the first portions P1 may be disposed outside the chamber CB. At least a portion of each of the first portions P1 may be disposed inside the chamber CB. The first portions P1 may be disposed throughout the inside/outside of the chamber CB. At least a portion of the portion of each of the first portions P1, which is disposed inside the chamber CB, may overlap the coil shield S.

The first portions P1 may be disposed to be spaced apart from each other in the third direction DR3. The first portions P1 may include an inlet through which the refrigerant is introduced (or flows in) and an outlet through which the refrigerant is discharged. In an embodiment, for example, the portions of the first portions P1, which are disposed outside the chamber CB, may correspond to the inlet through which the refrigerant is introduced and the outlet through which the refrigerant is discharged, respectively.

Each of the first portions P1 may be a flexible tube which is bendable, foldable, or the like. The first portions P1 may include an elastic material or a flexible material. The first portions P1 may include at least one selected from rubber-based elastomer, silicone-based elastomer, urethane-based elastomer, ester-based elastomer, and urethane acrylate-based elastomer. However, the disclosure is not limited thereto, and the first portions P1 may include various flexible materials known in the art.

When the position of the coil CP is changed, the coil CP may move without damage to the coil CP as the first portions P1 include the elastic material or the flexible material. In an embodiment, for example, when the moving member MP moves in the third direction DR3, the first portions P1 of the coil CP may stretch along the third direction DR3 as the first portions P1 include the elastic material or the flexible material. Accordingly, the coil CP may not be damaged.

The second portions P2 may extend in the second direction DR2, and at least a portion of the second portions P2 may be connected to the first portions P1. The second portions P2 may be disposed to be spaced apart from each other in the third direction DR3. The second portions P2 may be disposed inside the chamber CB.

The second portions P2 may include a material different from the material of the first portions P1. In an embodiment, for example, the second portions P2 may include at least one selected from copper (Cu), brass, and aluminum (Al).

The third portions P3 may extend in the third direction DR3, and be connected to the second portions P2. In an embodiment, for example, the third portion P3 may extend in the third direction DR3 from one end of the second portion P2, to connect two second portions P2 spaced apart from each other. The third portions P3 may be disposed to be spaced apart from each other in the second direction DR2. The third portions P3 may be disposed inside the chamber CB.

A length of each of the third portions P3 may be shorter than a length of each of the second portions P2. However, the disclosure is not limited thereto.

The third portions P3 may include a material different from the material of the first portions P1. The third portions P3 may include a same material as the second portions P2. In an embodiment, for example, the second portions P2 may include at least one selected from copper (Cu), brass, and aluminum (Al).

Referring to FIG. 5, in another embodiment, the first portions P1 may extend along the third direction DR3. The first portions P1 may extend in the third direction DR3, and at least a portion of each of the first portions P1 may be a portion of the coil CP, which is disposed outside of the chamber CB. The first portions P1 may be disposed to be spaced apart from each other along the second direction DR2.

The second portions P2 may extend in the third direction DR3, and at least a portion of the second portions P2 may be connected to the first portions P1. The second portions P2 may be disposed to be spaced apart from each other in the second direction DR2. The second portions P2 may be disposed inside the chamber CB.

The third portions P3 may extend in the second direction DR2, and be connected to the second portions P2. In an embodiment, for example, the third portion P3 may extend in the second direction DR2 from one end of the second portion P2, to connect two second portions P2 spaced apart from each other. The third portions P3 may be disposed to be spaced apart from each other in the third direction DR3. The third portions P3 may be disposed inside the chamber CB.

A length of each of the third portions P3 may be shorter than a length of each of the second portions P2. However, the disclosure is not limited thereto.

Hereinafter, a structure of the coil shield S in accordance with an embodiment of the disclosure and a principle in which the opening ratio of the opening H of the coil shield S is adjusted will be described with reference to FIGS. 6 to 8.

Figure 6:
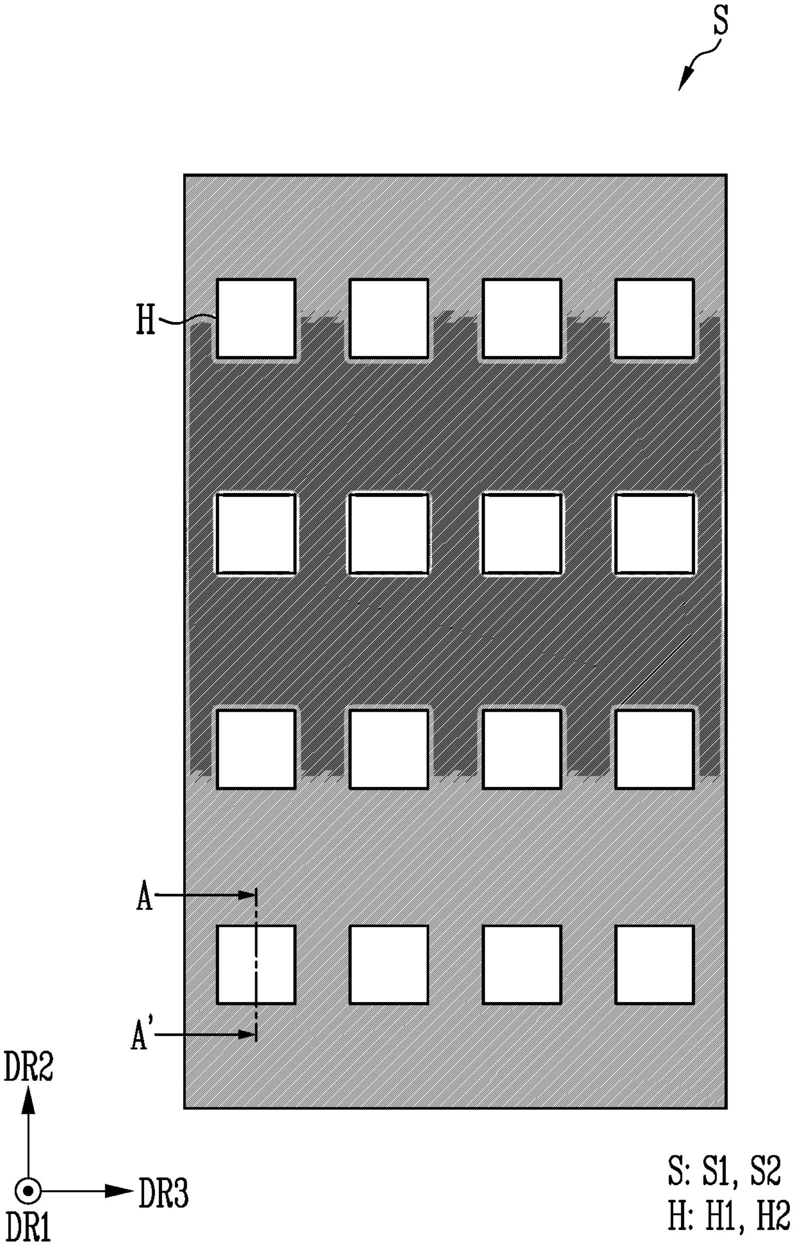
FIG. 6 is a schematic plan view of a coil shield in accordance with an embodiment of the disclosure.

FIG. 6 is a schematic plan view of a coil shield in accordance with an embodiment of the disclosure. FIGS. 7 and 8 are schematic sectional views of the coil shield in different opening ratios. FIGS. 7 and 8 may be sectional views taken along line A-A' shown in FIG. 6. FIG. 7 may be a schematic sectional view of the coil shield S when the opening ratio is 100%. FIG. 8 may be a schematic sectional view of the coil shield S when the opening ratio is 0%.

Figure 7:
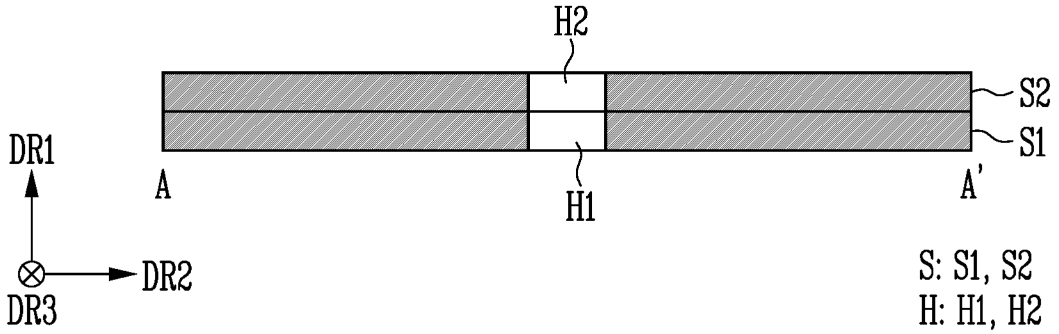
FIGS. 7 and 8 are schematic sectional views of the coil shield in different opening ratios.
Figure 8:
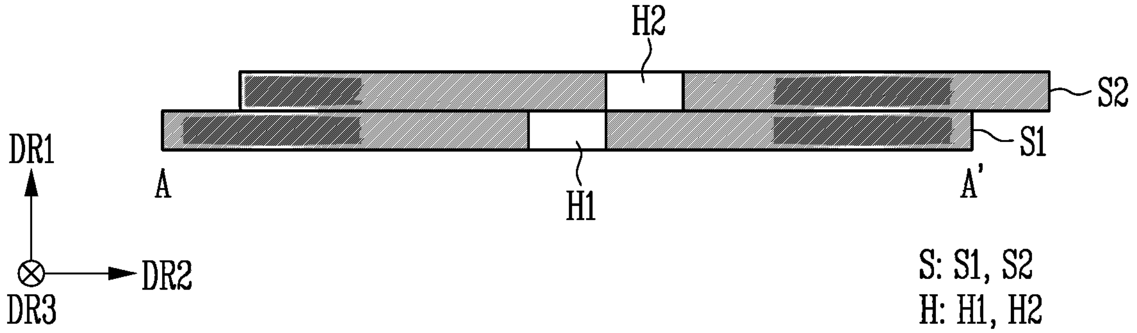

Referring to FIGS. 7 and 8, in an embodiment, the coil shield S may include a first coil shield S1 and a second coil shield S2. The second coil shield S2 may be disposed on the first coil shield S1. The first coil shield S1 and the second coil shield S2 may be disposed while being in contact with each other. In an embodiment, for example, the first coil shield S1 and the second coil shield S2 may be disposed to overlap each other in a plan view on which the coil shield S is disposed.

The first coil shield S1 and the second coil shield S2 may have a same shape as each other. Each of the first coil shield S1 and the second coil shield S2 may have a rectangular planar shape having short sides in the second direction DR2 and long sides in the third direction DR3 intersecting the second direction DR2. However, the disclosure is not limited thereto. The first coil shield S1 and the second coil shield S2 may have different shapes, and each of the first coil shield S1 and the second coil shield S2 may include a planar shape such as a polygon including a quadrangle, a circle, or an ellipse.

A cross section (hereinafter, referred to as section) of each of the first coil shield S1 and the second coil shield S2 in the third direction DR3 may have a quadrangular shape. In an embodiment, for example, the section of each of the first coil shield S1 and the second coil shield S2 may have a form in which quadrangles are disposed with openings H1 and H2 interposed therebetween.

The section of each of the first coil shield S1 and the second coil shield S2 may have a quadrangular shape, and referring to FIG. 2, the coil shield S may expose a side surface of the coil CP. In some embodiments, when the side surface of the coil CP is exposed, a larger amount of water ($H_2O$) may be adsorbed to the side surface of the coil CP, and the adsorption amount of water ($H_2O$) may be adjusted based on whether the side surface of the coil CP is exposed.

The first coil shield S1 may be provided with a first opening H1. The first opening H1 may be provided in plural. The first openings H1 may be disposed to be spaced apart from each other along the second direction DR2 and the third direction DR3. At least some of the first openings H1 may be disposed to overlap the coil CP when viewed on the plane on which the coil CP is disposed.

The first openings H1 may have a quadrangular shape. However, the disclosure is not limited thereto, and the first openings H1 may have a planar (or sectional) shape such as a polygon, a circle, or an ellipse.

The second coil shield S2 may be provided with a second opening H2. The second opening H2 may be provided in plural. The second openings H2 may be disposed to be spaced apart from each other along the second direction DR2 and the third direction DR3. At least some of the second openings H2 may be disposed to overlap the coil CP when viewed on the plane on which the coil CP is disposed.

The second openings H2 may have a same shape as the first openings H1. In an embodiment, for example, the second openings H2 may have a quadrangular shape. However, the disclosure is not limited thereto, and the second openings H2 may have a shape different from the shape of the first openings H1. The second openings H2 may have a planar (or sectional) shape such as a polygon, a circle, or an ellipse.

The first coil shield S1 and the second coil shield S2 may be disposed while being slidably in contact with each other. In an embodiment, for example, the first coil shield S1 may be stopped, and the second coil shield S2 may be slid with respect to the first coil shield S1. In an embodiment, for example, the second coil shield S2 may be stopped, and the first coil shield S1 may be slid with respect to the second coil shield S2. In an embodiment, for example, both the first coil shield S1 and the second coil shield S2 may be slid with respect to each other.

The first coil shield S1 and the second coil shield S2 may be slid with respect to each other, to adjust an opening ratio of the opening H. The first coil shield S1 and the second coil shield S2 may be slid with respect to each other, to adjust an overlapping ratio between the first openings H1 and the second openings H2 (hereinafter, referred to as the opening ratio of the opening H).

The first coil shield S1 and the second coil shield S2 may be disposed in a first sliding state. The first sliding state may be defined as a case where the opening ratio of the opening H is 100%. When the opening ratio of the opening H is 100%, the first coil shield S1 and the second coil shield S2 may be disposed to completely overlap each other in a plan view. The first openings H1 and the second openings H2 may be disposed to entirely overlap with each other in a plan view.

Referring to FIG. 8, in some embodiments, the second coil shield S2 or the first coil shield S1 may be slid in the second direction DR2, so that at least a portion of the first coil shield S1 is disposed not to overlap at least a portion of the second coil shield S2 in a plan view.

The first coil shield S1 and the second coil shield S2 may be disposed in a second sliding state. The second sliding state may be defined as a case where the opening ratio of the opening H is 0%. When the opening ratio of the opening H is 0%, at least a portion of the first coil shield S1 may not overlap with at least a portion of the second coil shield S2 in a plan view. The first openings H1 and the second openings H2 may be disposed not to completely overlap with each other in a plan view.

In an embodiment, as shown in FIGS. 7 and 8, the first coil shield S1 and the second coil shield S2 may be slid in the second direction DR2. However, the disclosure is not limited thereto. In some embodiments, the first coil shield S1 and the second coil shield S2 may be slid in the third direction DR3.

As the first coil shield S1 and the second coil shield S2 move, the opening ratio of the opening H may be adjusted, and the amount of water ($H_2O$) moved between the openings H may be determined. Accordingly, the sputtering apparatus 1000 in accordance with an embodiment of the disclosure can adjust the amount of water ($H_2O$) adsorbed to the coil CP.

Figure 9:
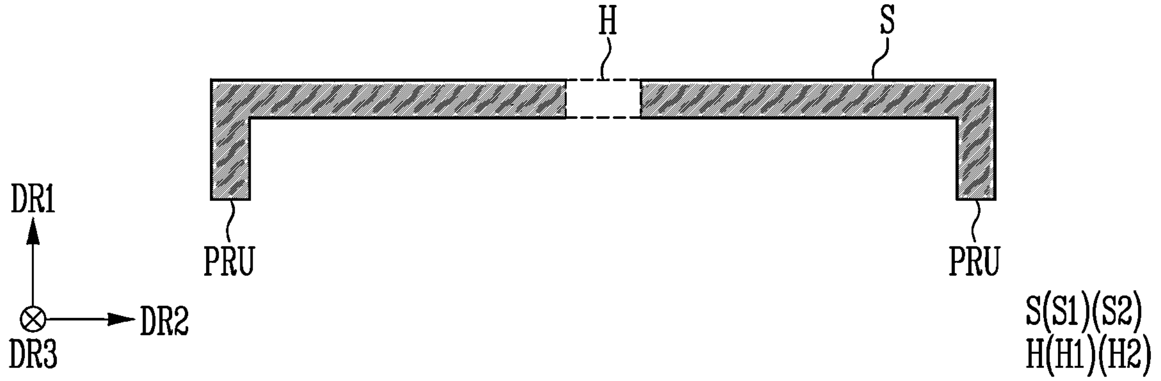
FIG. 9 is a schematic sectional view of a coil shield in accordance with another embodiment of the disclosure.

Hereinafter, a shape of the coil shield S in accordance with another embodiment of the disclosure will be described with reference to FIG. 9. FIG. 9 is a schematic sectional view of a coil shield in accordance with another embodiment of the disclosure. The embodiment of the coil shield S shown in FIG. 9 is substantially the same as the embodiment shown in FIG. 8, except that the coil shield includes a protrusion PRU.

The coil shield S shown in FIG. 9 may be each of the first coil shield S1 and the second coil shield S2, and the opening H shown in FIG. 9 may be each of the first opening H1 and the second opening H2.

Referring to FIG. 9, the coil shield S may include a protrusion PRU. The coil shield S may include a protrusion PRU extending in a lower direction (e.g., a direction opposite to the first direction DR1) at each of one end portion (first end portion) thereof and the other end portion (second end portion) parallel to the one end portion.

The coil shield S may include the protrusion PRU, and the coil shield S may properly protect the side surface of the coil CP. In an embodiment, for example, the protrusion PRU may be disposed to overlap atoms of the target T, facing a side surface of the coil shield S, so that a deposition amount of the target T deposited on the side surface of the coil shield S can be decreased.

In some embodiments, the protrusion PRU of the coil shield S may overlap at least a portion of the side surface of the coil CP when viewed in the second direction DR2 or the third direction DR3. However, the disclosure is not limited thereto, and the protrusion PRU of the coil shield S may not overlap at least a portion of the side surface of the coil CP when viewed in the second direction DR2 or the third direction DR3.

In accordance with embodiments of the disclosure, a sputtering apparatus may control the amount of a material for determining the quality of a thin film while forming a pressure condition close to vacuum in a chamber of the sputtering apparatus.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A sputtering apparatus comprising:
- a chamber;
- a target disposed inside the chamber;
- a coil disposed adjacent to the target;
- a moving member on which the coil is disposed, wherein the moving member adjusts a position of the coil in a first direction which is a direction perpendicular to a plane on which the coil is disposed; and
- a coil shield disposed inside the chamber to overlap the coil,
- wherein a plurality of openings is defined in the coil shield through a top surface of the coil shield,
- wherein the coil shield is movable in a second direction extending along the plane and intersecting the first direction, and
- wherein an opening ratio of each of the plurality of openings is adjusted when the coil shield moves.

2. The sputtering apparatus of claim 1, further comprising:
- a substrate disposed inside the chamber,
- wherein the target includes a material to be deposited on the substrate,
- wherein one surface of the substrate faces the plane on which the coil is disposed, and
- wherein the coil is disposed between the substrate and the moving member.

3. The sputtering apparatus of claim 1, wherein the moving member is a stage which adjusts a height at which the coil is disposed.

4. The sputtering apparatus of claim 1, wherein the moving member includes a screw or a cylinder.

5. The sputtering apparatus of claim 4, wherein the screw or the cylinder is provided in plural, and the moving member adjusts a height at which the coil is disposed.

6. The sputtering apparatus of claim 2, wherein the coil shield is disposed between the substrate and the coil.

7. The sputtering apparatus of claim 1, wherein the coil shield includes a first coil shield and a second coil shield disposed on the first coil shield, and
- wherein the first coil shield and the second coil shield are in contact with each other, and one of the first coil shield and the second coil shield is slidably moveable in the second direction with respect to the other of the first coil shield and the second coil shield.

8. The sputtering apparatus of claim 7, wherein a first opening is defined in the first coil shield through a top surface of the first coil shield, and
- a second opening is defined in the second coil shield through a top surface of the second coil shield, and
- wherein each of the first opening and the second opening has a polygonal, circular or elliptical planar shape.

9. The sputtering apparatus of claim 8, wherein the first coil shield and the second coil shield have a same shape as each other, and
- wherein each of the first opening and the second opening is provided in plural.

10. The sputtering apparatus of claim 8, wherein the first coil shield and the second coil shield are disposed in a first sliding state and a second sliding state,
- wherein, in the first sliding state, the first opening and the second opening entirely overlap each other, and
- wherein, in the second sliding state, the first opening and the second opening do not overlap each other.

11. The sputtering apparatus of claim 2, wherein the coil shield has a quadrangular cross section.

12. The sputtering apparatus of claim 2, wherein the coil shield includes a first end portion and a second end portion, and
- wherein the coil shield includes a protrusion at each of the first end portion and the second end portion.

13. The sputtering apparatus of claim 1, wherein the coil includes a first portion including an elastic material or a flexible material.

14. The sputtering apparatus of claim 13, wherein at least a portion of the first portion corresponds to an inlet through which a refrigerant flows therein.

15. A sputtering apparatus comprising:
- a chamber;
- a target disposed inside the chamber;
- a coil disposed adjacent to the target; and
- a coil shield disposed inside the chamber to overlap the coil,
- wherein the coil shield includes a first coil shield and a second coil shield disposed on the first coil shield, wherein the first coil shield and the second coil shield are in contact with each other, and one of the first coil shield and the second coil shield is slidably moveable in a direction in which a plane on which the coil is disposed extends with respect to the other of the first coil shield and the second coil shield, wherein a plurality of openings is defined in the coil shield through a top surface of the coil shield, and wherein an opening ratio of each of the plurality of openings is adjusted when one of the first coil shield and the second coil shield slidably moves with respect to the other of the first coil shield and the second coil shield.

16. The sputtering apparatus of claim 15, further comprising:

a substrate disposed inside the chamber, wherein the target includes a material to be deposited on the substrate, wherein one surface of the substrate faces a plane on which the coil is disposed, and wherein the coil shield is disposed between the substrate and the coil.

17. The sputtering apparatus of claim 15, wherein a first opening is defined in the first coil shield through a top surface of the first coil shield, and a second opening is defined in the second coil shield through a top surface of the second coil shield, and wherein each of the first opening and the second opening has a polygonal, circular or elliptical planar shape.

18. The sputtering apparatus of claim 17, wherein the first coil shield and the second coil shield have a same shape as each other, and wherein each of the first opening and the second opening is provided in plural.

19. The sputtering apparatus of claim 15, wherein the coil includes a first portion including an elastic material or a flexible material, and wherein at least a portion of the first portion corresponds to an inlet through which a refrigerant flows therein.

* * * * *